United States Patent
Martens

(10) Patent No.: US 6,766,262 B2
(45) Date of Patent: Jul. 20, 2004

(54) METHODS FOR DETERMINING CORRECTED INTERMODULATION DISTORTION (IMD) PRODUCT MEASUREMENTS FOR A DEVICE UNDER TEST (DUT)

(75) Inventor: Jon S. Martens, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 177 days.

(21) Appl. No.: 10/157,546

(22) Filed: May 29, 2002

(65) Prior Publication Data

US 2003/0222652 A1 Dec. 4, 2003

(51) Int. Cl.[7] ............................................... H04B 1/10
(52) U.S. Cl. ..................... 702/69; 702/191; 455/423
(58) Field of Search ................ 702/69–74, 79, 702/89, 106, 107, 66, 117–120, 124, 189–195; 324/620, 624, 602, 603, 605, 608, 613, 614; 455/63.1, 65, 67.13, 67.14, 302–305, 423

(56) References Cited

U.S. PATENT DOCUMENTS

| | | | | |
|---|---|---|---|---|
| 5,818,240 | A | | 10/1998 | Cabot ........................ 324/626 |
| 6,009,129 | A | * | 12/1999 | Kenney et al. ............. 375/346 |
| 6,066,953 | A | | 5/2000 | Wadell ....................... 324/601 |
| 6,263,289 | B1 | * | 7/2001 | Hassun et al. ................ 702/69 |
| 6,292,000 | B1 | | 9/2001 | Kapetanic et al. .......... 324/623 |
| 6,316,945 | B1 | | 11/2001 | Kapetanic et al. .......... 324/623 |
| 6,646,449 | B2 | * | 11/2003 | Seppinen et al. ........... 324/624 |

OTHER PUBLICATIONS

"Harmonics Measurements, Scorpion™," Anritsu, Application Note, 7 pp. (date unknown).
Hassun, Roland, et al., "Ultra–Linear Power Amplifier Characterization Using Dynamic Range Extension Techniques," Proc. of the 2001 IEEE MITT–S Int. Micr. Symposium, May 2001, Phoenix, AZ, 4 pp.
"Intermodulation Distortion (IMD), Scorpion® Option 13," Anritsu, Application Note, Apr. 2000, Rev: C, 7pp.
"Intermodulation Distortion (IMD) Measurements, Using the 37300 Series Vector Network Analyzer," Anritsu, Application Note, Sep. 2000, Rev. A, 11 pp.
"Theory of Intermodulation Distortion Measurement (IMD)," Maury Microwave Corp., Application Note 5C–043, Jul. 27, 1999, 3 pp.

* cited by examiner

Primary Examiner—Marc S. Hoff
Assistant Examiner—Craig Steven Miller
(74) Attorney, Agent, or Firm—Fliesler Meyer, LLP

(57) ABSTRACT

Methods for determining a corrected intermodulation distortion (IMD) product measurement for a device under test (DUT) are provided. A ratioed receiver IMD product is measured, where the receiver IMD product results from non-linearities in a receiver. Next, a ratioed composite IMD product is measured, where the composite IMD product results from non-linearities in both the receiver and the DUT. The corrected DUT IMD product (DUTP) can then be determined by subtracting the ratioed receiver IMD product from the ratioed composite IMD product to remove the effects of IMD due to the receiver.

18 Claims, 7 Drawing Sheets

METHODS FOR DETERMINING CORRECTED INTERMODULATION DISTORTION (IMD) PRODUCT MEASUREMENTS FOR A DEVICE UNDER TEST (DUT)

BACKGROUND

1. Field of the Invention

The present invention relates to methods for determining corrected intermodulation distortion (IMD) measurements for a device under test (DUT). The present invention is for use with an appropriate measuring device, such as a vector network analyzer (VNA).

2. Description of the Related Art

Intermodulation distortion (IMD) is defined as nonlinear distortion (i.e., distortion caused by a deviation from a linear relationship between specified input and output parameters of a system or component) characterized by the appearance, in the output of a device, of frequencies that are linear combinations of the fundamental frequencies and all harmonics present in the input signals. It is noted that harmonic components themselves are not usually considered to characterize intermodulation distortion. IMD occurs when the non-linearity of a device with multiple input frequencies causes undesired outputs at other frequencies. In a communications system, for example, this means that signals in one channel can cause interference with adjacent channels.

IMD distortion can be explained with reference to the frequency vs. power graph 100 of FIG. 1. Assume that a signal including two tones at frequencies $f_1$ and $f_2$ is applied to a device under test (DUT). The difference (i.e., offset) in frequency between the two tones can be anywhere between a few kHz and many MHz, although other values are possible. The non-linear characteristics of the DUT generate IMD products, including products at $2f_1-f_2$ and $2f_2-f_1$, which are known as third order products. The relationship of these various spectral components is illustrated in FIG. 1. As shown, the third order IMD products are close to the original tones in frequency, and thus, represent potential adjacent channel spurious signals. Fifth order IMD products occur at $3f_1-2f_2$ and $3f_2-2f_1$. Seventh order IMD products (not shown) occur at $4f_1-3f_2$ and $4f_2-3f_1$. Second order IMD products (not shown) occur at $f_1-f_2$ and $f_2-f_1$. The IMD products of interest are typically the third order products, and possibly the fifth order products. Seventh and second order IMD products are also sometimes of interest. It is recognized that other IMD products, not specifically mentioned here, may also be of interest.

IMD measurements are extremely important in the design and characterization of amplifiers, mixers, passives and other components in communications and other systems. IMD provides a measure of non-linearity and the likelihood that a device will generate signals (due to this non-linearity) that may interfere with other (e.g., adjacent) communications channels. As the density of communications links increase, the requirements grow for lower and lower IMD levels hence making the measurement even more important. At very low IMD levels, the distortion of the measuring receiver itself sometimes limits the measurement. Embodiments of the present invention provides techniques for reducing the effects of those distortions, thus allowing IMD measurements over a wider dynamic range.

Historically, IMD measurements have normally been done in a scalar sense and all measured non-DUT signal products were attempted to be minimized through test set architecture and then neglected. The dynamic range with these setups is often not limited by the noise floor of the receiver, but rather by the IMD products of the receiver or of the source system. While certain techniques have been used to reduce receiver IMD issues, they have limitations.

One possible method for reducing receiver IMD is to pad the receiver input so that signal levels lower, thereby lowering received IMD products. The problem with this solution is that the noise floor is increased.

Another possible method for reducing receiver IMD is to filter the main tones entering the receiver. The problem with this solution is that it restricts measurement to a very narrow frequency range.

Still another possible solution is to feed-forward tone products to cancel IMD at the receiver input. The problem with this solution is that a complex test set is required. Additionally, there are some frequency limitations. Further, the feed-forward must be dynamically adjusted.

Thus, there is a need to correct for receiver IMD products to thereby increase the accuracy of IMD product measurements for DUTs and to allow IMD measurements over a wide dynamic range. The approach for correcting for receiver IMD products preferably overcomes some or all of the above mentioned problems.

BRIEF SUMMARY OF THE INVENTION

The present invention is directed to methods for determining corrected intermodulation distortion (IMD) products for devices under test (DUTs). A ratioed receiver IMD product is measured, where the receiver IMD product results from non-linearities in a receiver of the measuring device (e.g., a vector network analyzer). Next, a ratioed composite IMD product is measured, where the composite IMD product results from non-linearities in both the receiver and the DUT. The corrected DUT IMD product (DUTP) can then be determined by subtracting the ratioed receiver IMD product from the ratioed composite IMD product.

In accordance with an embodiment of the present invention, a first signal having a first frequency ($f_1$) and a second signal having a second frequency ($f_2$) are combined to produce a combined signal having spectral components at the first frequency ($f_1$) and the second frequency ($f_2$). The combined signal is then split (e.g., using a coupler) into a first combined signal and a second combined signal each having spectral components at the first frequency ($f_1$) and the second frequency ($f_2$). The first combined signal is provided to a non-linear device to produce a reference signal having spectral components at the first frequency ($f_1$), the second frequency ($f_2$) and at additional frequencies. The spectral components at the additional frequencies are reference intermodulation distortion (IMD) products. The reference signal is provided to a reference input of the analyzer being used to make the measurements.

A power level of the second combined signal is adjusted to a desired level and provided to a receiver input of the analyzer. At this point, a measurement is made of the second combined signal ratioed to the reference signal, at one of the first frequency ($f_1$) and the second frequency ($f_2$). This measurement is referred to as a ratioed receiver main tone (RM) measurement. A measurement is also made of the second combined signal ratioed to the reference signal, at a frequency associated with an IMD product of interest (e.g., a $3^{rd}$ order IMD product). This measurement is referred to as a ratioed receiver IMD product (RP) measurement. The RM and RP ratioed measurements effectively calibrate the effects of IMD due to the receiver, enabling the receiver effects to be removed from the DUT measurements.

Now that the system has been calibrated, the second combined signal is provided to the DUT to thereby produce a device output signal. The power level of the second combined signal is adjusted such that the device output signal of the DUT is substantially equal to the desired level. This device output signal is provided to the receiver input of the analyzer. At this point, a measurement can be made of the device output signal ratioed to the reference input signal, at the chosen one of the first frequency ($f_1$) and the second frequency ($f_2$). This measurement is referred to as a ratioed composite main tone (CM) measurement. A measurement is also made of the device output signal ratioed to the reference input signal, at the frequency associated with the IMD product of interest. This measurement is referred to as a ratioed composite IMD product (CP) measurement.

Finally the corrected DUT IMD product (DUTP) can be calculated using the measurements that have been made. In one embodiment, the corrected DUTP is calculated according to the equation: DUTP=CP−RP. In another embodiment, the corrected DUTP is calculated in according with the equation:

$$DUTP = CP - RP \cdot e^{j \arg\left(\frac{CM}{RM}\right)}.$$

DUTP is the actual DUT intermodulation product ratioed against the reference intermodulation product. However, this may not always be the most useful expression. A somewhat more useful expression would be DUTP ratioed against the DUT output main tone, which should be amplitude corrected. This can be accomplished by also measuring the reference signal power, at the selected one of the first frequency ($f_1$) and the second frequency ($f_2$), to produce an unratioed reference main tone (A1M) measurement. Further, the reference signal power is measured at the frequency associated with the IMD product of interest, to produce an unratioed reference IMD product (A1P) measurement. Then, the DUTP can be ratioed against the composite main tone to eliminate the effects of receiver IMD on signal power measurements.

BRIEF DESCRIPTION OF THE DRAWINGS/ FIGURES

Embodiments of the present invention will become more apparent from the detailed description set forth below when taken in conjunction with the drawings in which like reference characters identify the same or similar elements throughout and wherein.

DETAILED DESCRIPTION OF THE INVENTION

As mentioned above, the distortions of a measuring receiver itself may limit IMD measurements. Embodiments of the present invention provide techniques for reducing the effects of those distortions, thus allowing IMD measurements over a wide dynamic range. The concept is to subtract out receiver contributions to measured IMD products. In accordance with embodiments of the present invention, signal subtraction is vectorial. Further, signal purity may not be excellent, and signal levels maybe small. Accordingly, a ratioed measurement approach is used.

The concept of ratioed non-linear measurements has been broached before in the context of harmonics. This is described in U.S. Pat. No. 6,316,945, entitled "Process for Harmonic Measurement Accuracy enhancement," which is incorporated herein by reference in its entirety. A key lies in how a sufficiently large reference signal is generated. In the case of harmonics, a switchable Schottky diode was used in the source path to generate a harmonic to be used as the reference. In the case of IMD, measurement is somewhat more complicated since two signal sources must be combined before the artificial non-linearity is introduced and the combined signal is sent to the reference path.

Embodiments of the present invention are directed to methods and systems for using an analyzer (e.g., analyzer 260 in FIGS. 2A and 2B) to measure IMD products for DUTs. Such an analyzer can be a signal analyzer, a spectrum analyzer, a vector network analyzer (VNA), a digitizing receiver, or any other similar measuring device that includes two synchronized receivers. One of the receivers is used as a reference receiver, while the other receiver is used as a primary receiver. Typically, one of the inputs on the analyzer will be labeled as a reference input (associated with the reference receiver), and another input will be labeled as a receiver input (associated with the primary receiver input). However, such explicit labeling is not always used, and thus, is not necessary. Rather, one of the receiver inputs can be arbitrarily defined as the receiver input with another being defined as the reference input.

Figure 1:
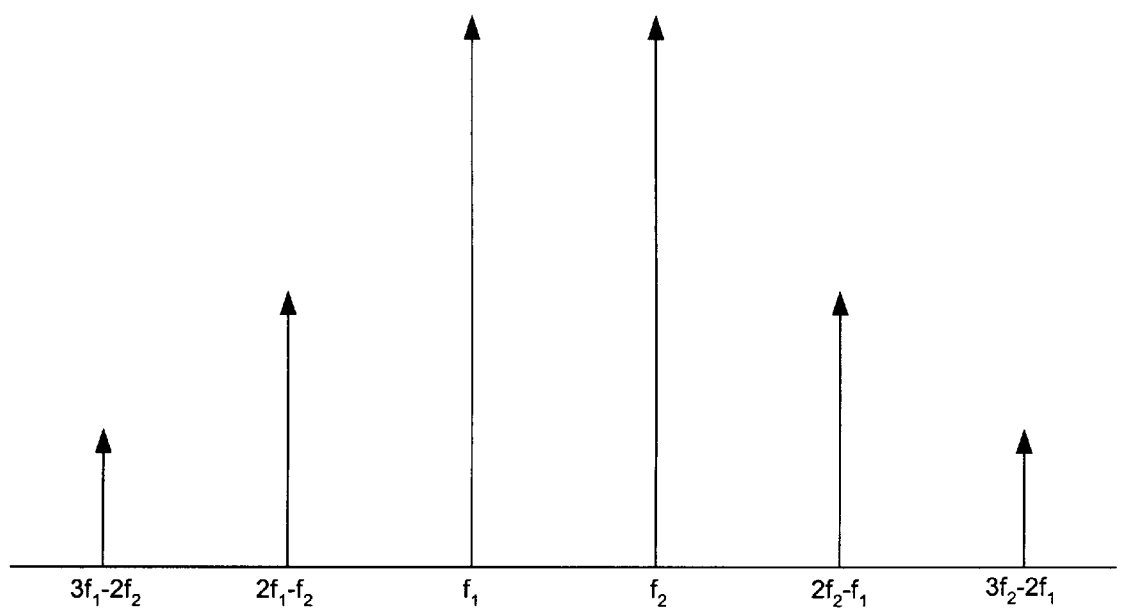
FIG. 1 is a graph that is useful for explaining the concept of IMD products.
Figure 2A:
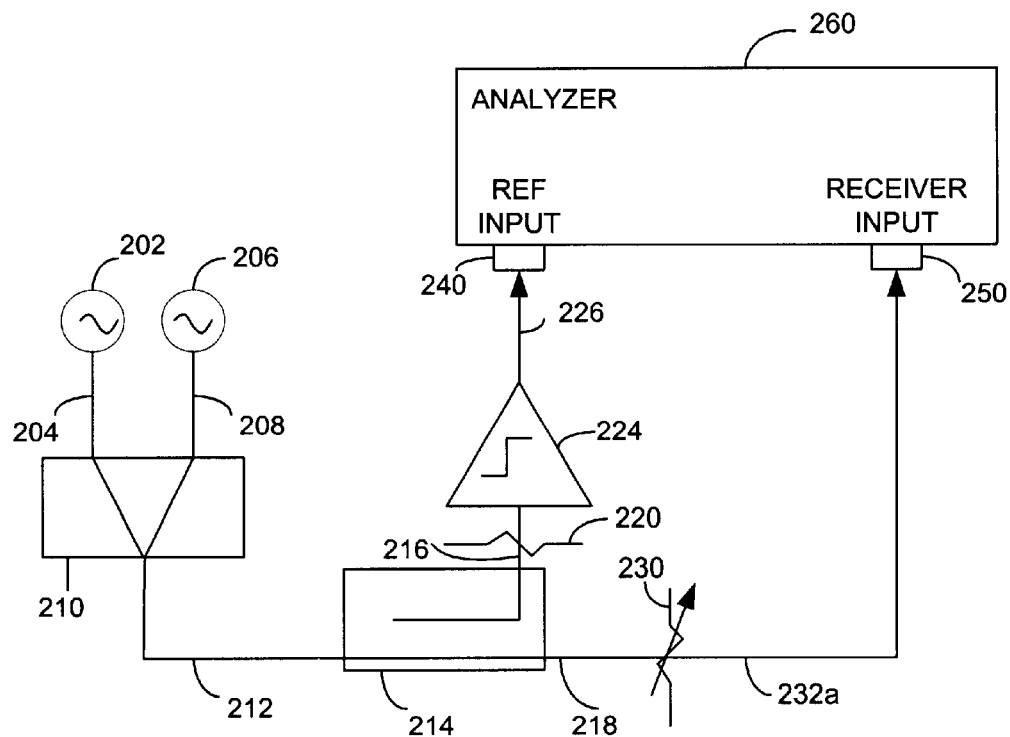
FIG. 2A is a block diagram of an architecture that is used for calibration, in accordance with an embodiment of the present invention.
Figure 2B:
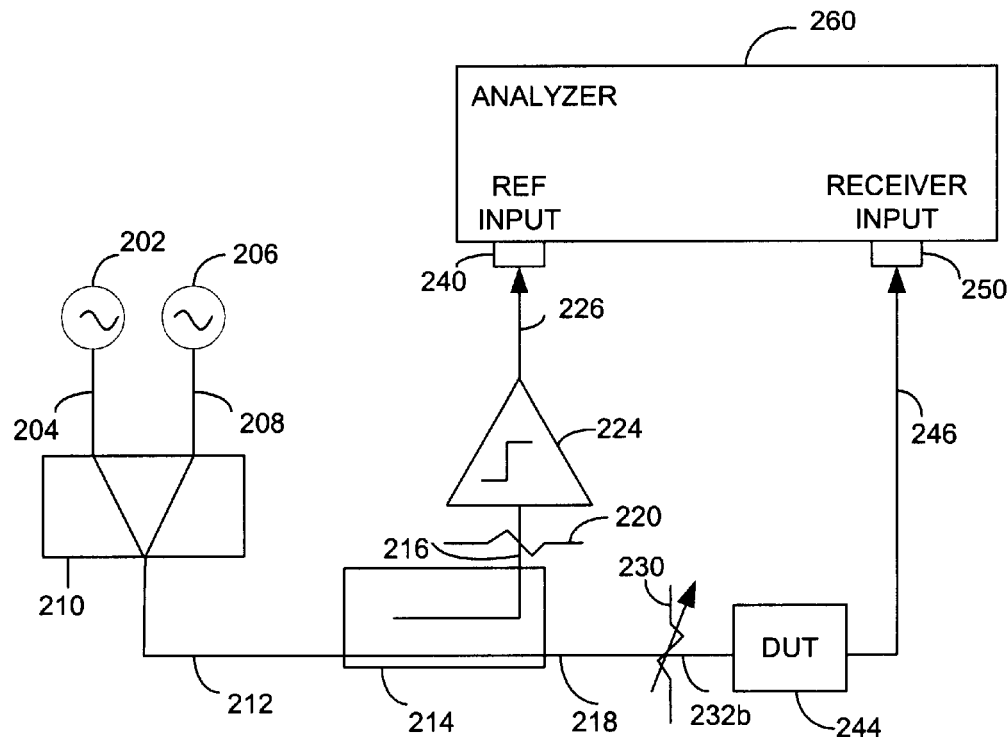
FIG. 2B is a block diagram of an architecture that is used for measuring IMD products, in accordance with an embodiment of the present invention.

One possible architecture for measuring IMD products, in accordance with embodiments of the present invention, is shown in FIGS. 2A and 2B, discussed below. FIG. 2B is a block diagram showing an architecture 200 for making ratioed IMD measurements, in accordance with embodiments of the present invention. FIG. 2A is a block diagram that is useful for explaining how calibration is performed.

In both FIGS. 2A and 2B, a first source 202 and a second source 206 generate, respectively, a first signal 204 (having a first frequency $f_1$) and a second signal 208 (having a second frequency $f_2$). Signals 204 and 208 preferably have substantially equal powers and a set frequency spacing or offset (i.e., $f_2-f_1=f_{offset}$). It is noted that first source 202 and second source 206 can be components of an analyzer 260 (e.g., a spectrum analyzer or a vector network analyzer). In other words, first signal 204 and second signal 208 can be generated by analyzer 260. Alternatively, first source 202 and second source 206 can be separate from analyzer 260. Thus, first signal 204 and second signal 208 can be generated outside of analyzer 260.

A signal combiner 210 combines first signal 204 and second signal 208 to produce a combined signal 212 having spectral components at $f_1$ and $f_2$. A coupler 214 splits combined signal 212 into first and second combined signals 216 and 218. First combined signal 216 is most likely of lower magnitude than second combined signal 218. An optional attenuator 220 is used to pad (i.e., buffer) an amplifier 224 from coupler 214 so that reflections do not sneak back into coupler 214 and effect second combined signal 218.

First combined signal 216 is fed to a non-linear device 224, which outputs a reference signal 226 that is provided to a reference input 240. Non-linear device 224, can be a non-linear amplifier that is heavily compressed at normal operation levels. Alternatively, non-linear device 224 can be a linear amplifier followed by a limiter (or similar non-linear device). Amplifier 224 may even be a non-linear amplifier followed by a limiter (or similar non-linear device). Other non-linear devices can be used instead of an amplifier. A diode that provides anon-linear reactance (e.g., a shunt diode) or a multiplier are some examples, which are not meant to be limiting, of other non-linear devices that can be used. The purpose of non-linear device 224 is to generate a sufficient IMD product at reference input 240 of analyzer 260 over the range of DUT input power levels of interest. A level of the IMD product (also referred to as the product level) should be large relative to the noise floor of the reference receiver. For example, the IMD product should be at least –50 dBm (decibels below 1 mW), and preferably at least –40 dBm.

It is noted that complications can arise when a tone offset is small since main tones may also get into the reference receiver input 240. Accordingly, sufficient filtering should be used in this case. It is also important that the path to reference input 240 not be driven too non-linearly, which will cause stability of the measurements to tend to decrease.

A variable attenuator 230 is provided after coupler 218 to attenuate second combined signal 218 as necessary, resulting in an attenuated signal 232. During calibration, attenuated second combined signal 232a is provided to a receiver input 250 of analyzer 260 (e.g., using a thru line), as shown in FIG. 2A. After calibration, a DUT 244 is inserted (e.g., in place of the thru line) and attenuated second combined signal 232b is provided to an input of DUT 244, as shown in FIG. 2B. A device output signal 246 is provided to receiver input 250 of analyzer 260.

In ratioed harmonic measurements, it is source harmonics that one is trying to remove, which can be done by linking the non-linear reference products to the source power. This is explained in the '945 patent that was incorporated by reference above. With IMD measurements, however, it is receiver-generated products that are more of a concern. Because DUT 244 will rarely have unity gain, it becomes more challenging to associate reference IMD products (provided to reference input 240) with a given test power level (provided to receiver input 250). A key is that the calibration (with the thru line in place) must include a power level near that of DUT output signal 246. Additionally, reference signal 226 must be the same with and without DUT 244 inserted. Variable attenuator 230 is used to meet this challenge. Various types of variable attenuators 230 can be used. For example, in one embodiment a leveling loop controlled to the output power of coupler 214 may even be used as an automatic variable attenuator 230.

Variable attenuator 230 allows movement between relevant power levels without changing reference signal 226 (and thus, the reference ID products). The purpose of variable attenuator 230 is to provide a power level during calibration (which occurs with DUT 244 removed) that is close to the output power level of DUT 244 (i.e., close to the power level of device output 246). Thus, variable attenuator 230 can have as few as two steps, for example, X and X+DUT gain. Variable attenuator 230 can thereby be set at X+DUT gain when DUT 244 is inserted, and at X when DUT 244 is removed (and replaced with thru line during calibration), to thereby keep the power level of the signals (232a and 246) provided to receiver input 250 relatively constant.

The calibration of system 200 is described in steps 308–314, discussed below with reference to FIG. 3. As mentioned above, calibration is important so that the receiver IMD products are characterized at the appropriate power levels. An important point is that the calibration is keyed to a power level. It is assumed that source powers (of first source 202 and second source 206) are set at the desired level for when DUT 244 is tested. Pads maybe used as necessary to keep within the power plan and to provide isolation as necessary.

A method 300 for using an analyzer 260 to determine a corrected intermodulation distortion (IMD) product of a device under test (DUT), in accordance with embodiments of the present invention, shall now be described with reference to the flow diagram of FIGS. 3A and 3B. Where appropriate, reference is also made to the components and signals shown in FIGS. 2A and 2B.

Figure 3A:
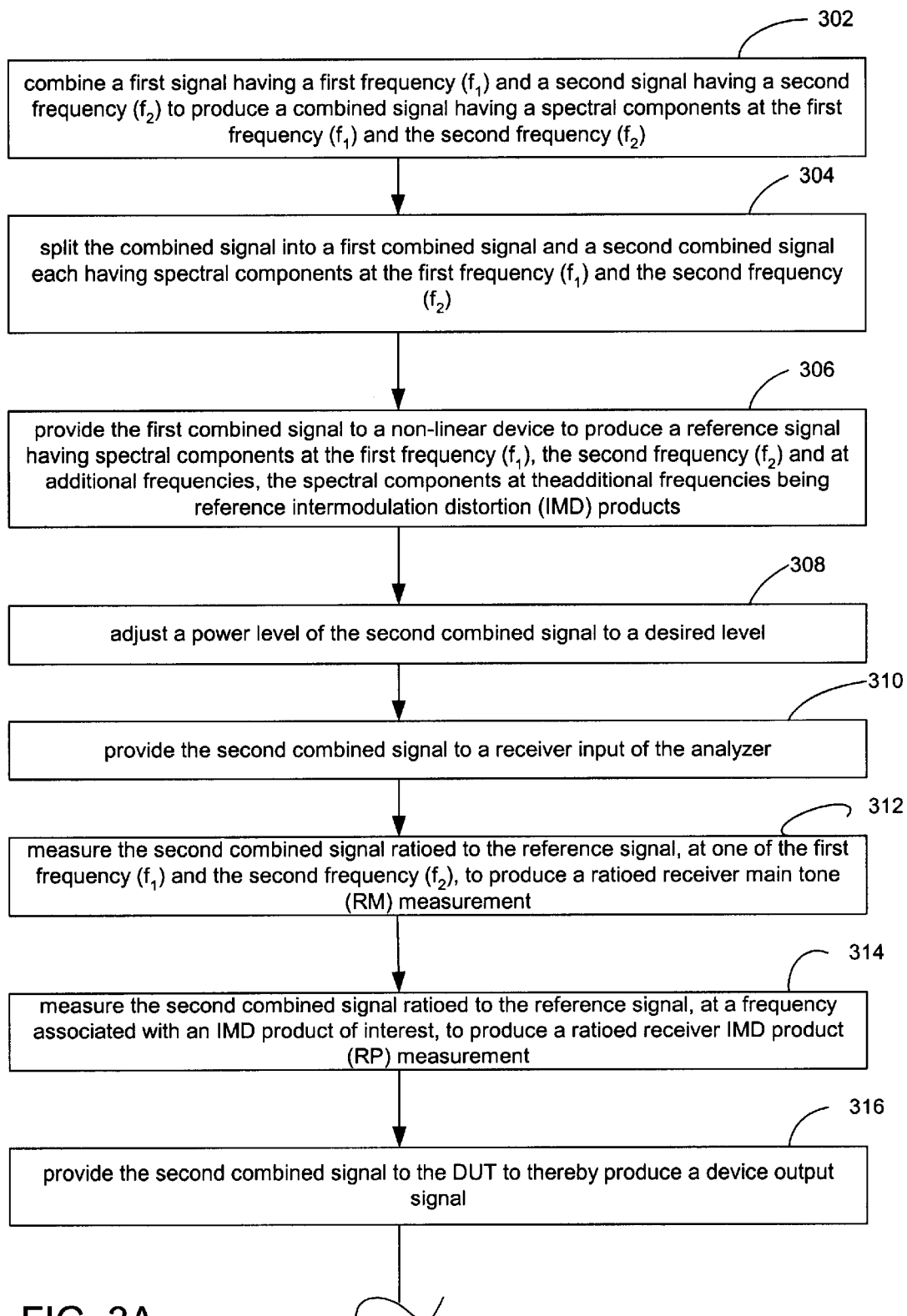
FIGS. 3A and 3B show a flow diagram of a method for using an analyzer to determine a corrected intermodulation distortion (IMD) product of a device under test (DUT), in accordance with embodiments of the present invention.
Figure 3B:
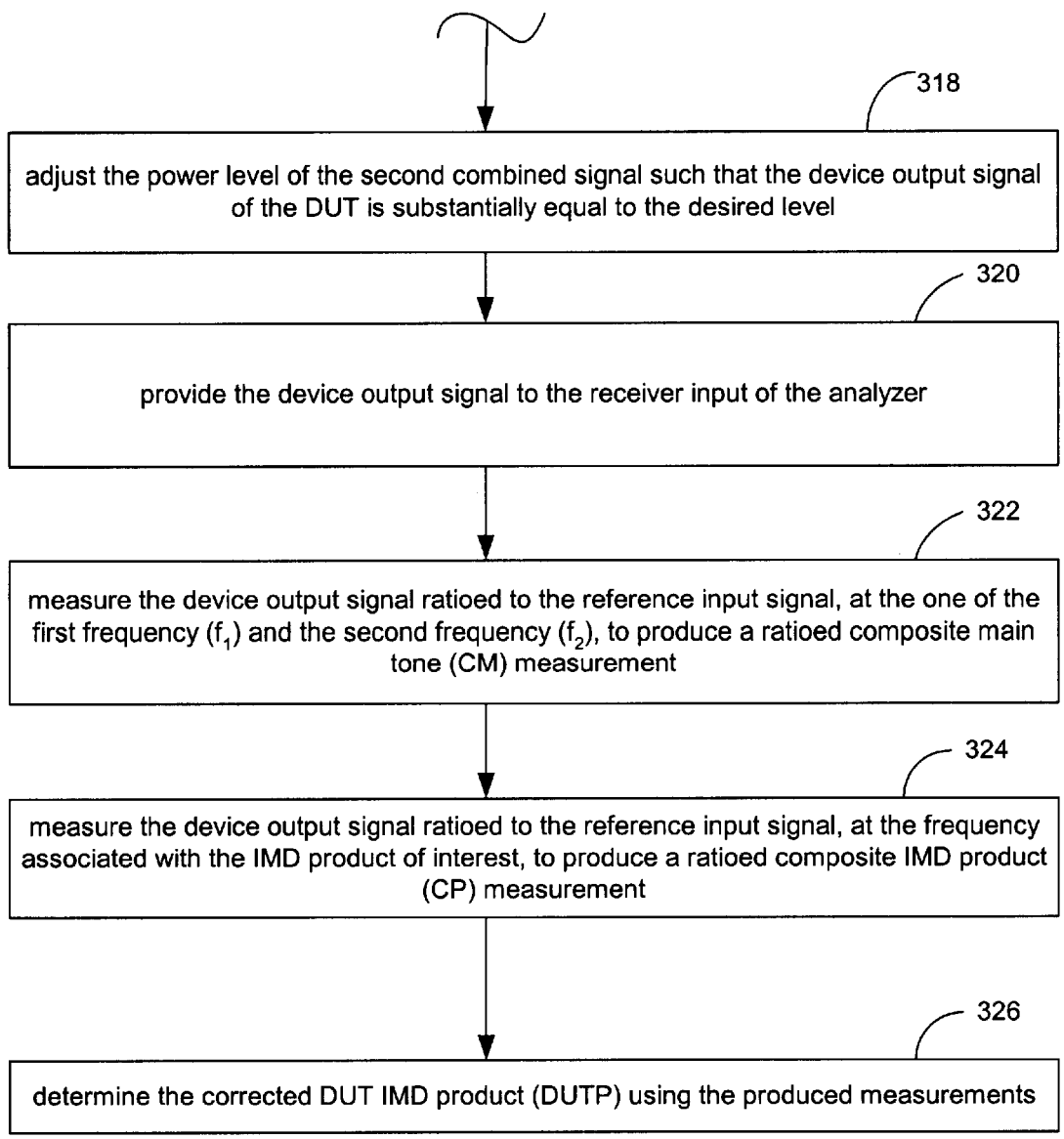

Referring first to FIG. 3A, at a first step 302, a first signal (e.g., signal 204) having a first frequency ($f_1$) and a second signal (e.g., signal 208) having a second frequency ($f_2$) are combined (e.g., by signal combiner 210) to produce a combined signal (e.g., signal 212) having spectral components at the first frequency ($f_1$) and the second frequency ($f_2$).

At a step 304, the combined signal (e.g., signal 212) is split into a first combined signal (e.g., signal 216) and a second combined signal (e.g., signal 218). Each of these combined signals have spectral components at the first frequency ($f_1$) and the second frequency ($f_2$). A coupler (e.g., coupler 214) or other appropriate splitting device can be used to split the combined signal.

At a step 306, the first combined signal (e.g., signal 216) is provided to anon-linear device to produce a reference signal (e.g., signal 226) having spectral components at the first frequency ($f_1$), the second frequency ($f_2$) and at additional frequencies. The adjusted second combined signal (e.g., 232) is also simply referred to, herein, as the second combined signal. The spectral components at the first frequency ($f_1$), the second frequency ($f_2$) are main tones. The spectral components at the additional frequencies are intermodulation distortion (IMD) products of the reference signal. As explained above, buffering pads can be used as necessary to prevent unwanted reflections from sneaking into the second combined signal (e.g., signal 218).

At a step 308, a power level of the second combined signal (e.g., signal 218) is adjusted to a desired level, resulting in an adjusted second combined signal (e.g., signal 232a). The desired level is a level equal to or close to the power level of an output of the DUT for which an IMD product is being measured. A variable attenuator (e.g., variable attenuator 230) can be used to perform the necessary signal adjustment, as explained above. The second combined signal (e.g., signal 232a) is provided to a receiver input of the analyzer (e.g., receiver input 250 of analyzer 260), at a step 310. Then, at a step 312, the analyzer is used to measure the second combined signal ratioed to the reference signal, at one of the first frequency ($f_1$) and the second frequency ($f_2$), to produce a ratioed receiver main tone (RM) measurement. This can be accomplished, for example, by measuring the scattering-parameter $S_{21}$ using analyzer 260, where the reference input 240 is port 1 and the receiver input 250 is port 2. The ratioed receiver main tone (RM) measurement is a complex number. Referring to FIG. 2A, the ratioed receiver main tone (RM) measurement is the ratio of second combined signal 232a to reference signal 226, at the selected one of the first frequency ($f_1$) and the second frequency ($f_2$).

At a step 314, the analyzer can also be used to measure the second combined signal ratioed to the reference signal, at a frequency associated with an IMD product of interest, to produce a ratioed receiver IMD product (RP) measurement. For example, if a $3^{rd}$ order IMD product is of interested, then this measurement would be made $2f_1-f_2$ or $2f_2-f_1$ (or both). If a $5^{th}$ order IMD product is of interest, then this measurement would be made at $3f_1-2f_2$ or $3f_2-2f_1$ (or both). This can be accomplished, for example, by measuring the scattering-parameter $S_{21}$ using the analyzer, where the reference input (e.g., reference input 240) is port 1 and the receiver input (e.g., receiver input 250) is port 2. The ratioed receiver IMD product (RP) measurement is a complex number. Referring to FIG. 2A, the ratioed receiver main tone (RM) measurement is the ratio of second combined signal 232a to reference signal 226, at the frequency associated with the IMD product of interest. The aforementioned steps relate to calibration. The following steps relate to applying the calibration.

At a step 316, the second combined signal (e.g., signal 232) is provided to the DUT (e.g., DUT 244) to thereby produce a device output signal (e.g., device output signal 246). At a step 318, the device output signal is adjusted (e.g., using variable attenuator 230 to adjust second combined signal 232) so that the power level of the device output signal (e.g., signal 246) is substantially equal to the desired level (mentioned instep 308). Of course such adjustment to second combined signal 232 can occur just before the signal is provide to the DUT (rather than after the signal is provided to the DUT). What is important is that signals 232a and 246 (both provided to receiver input 250) have about the same power level. The device output signal, having the desired level, is provided to the receiver input of the analyzer (e.g., to receiver input 250 of analyzer 260), at a step 320. Then, at a step 322, the analyzer is used to measure the device output signal ratioed to the reference input signal, at the one of the first frequency ($f_1$) and the second frequency ($f_2$), to produce a ratioed composite main tone (CM) measurement. This can be accomplished, for example, by measuring the scattering-parameter $S_{21}$ using the analyzer, where the reference input (e.g., reference input 240) is port 1 and the receiver input (e.g., receiver input 250) is port 2. The ratioed composite main tone (CM) measurement is a complex number. Referring to FIG. 2B, the ratioed composite main tone (CM) measurement is the ratio of device output signal 246 to reference signal 226, at the one of the first frequency ($f_1$) and the second frequency ($f_2$). The term composite is used because these measurements reflect characteristics of both the DUT (e.g., DUT 244) and the receiver (that is associated with receiver input 260).

At a step 324, the analyzer is used to measure the device output signal ratioed to the reference signal, at a frequency associated with an IMD product of interest, to produce a ratioed composite IMD product (CP) measurement. This can be accomplished, for example, by measuring the scattering-parameter $S_{21}$ using the analyzer, where the reference input (e.g., reference input 240) is port 1 and the receiver input (e.g., receiver input 250) is port 2. The ratioed composite IMD product (CP) measurement is a complex number. Referring to FIG. 2B, the ratioed composite main tone (CP) measurement is the ratio of device output signal 246 to reference signal 226, at the frequency associated with the IMD product of interest.

Finally, at a step 326, the corrected DUT IMD product (DUTP) is determined. In the simplest sense, the corrected DUTP can be calculated using Equation 1, shown below.

$$DUTP = CP - RP \qquad \text{(Equation 1)}$$

It is assumed, in Equation 1, that the presence of DUT-related IMD products does not alter the linearity state of the receiver. This is approximately equivalent to stating the receiver is in a state that can be described by a low order Volterra system. The equation also assumes that the source system (e.g., sources 202 and 206) is not responsible for any significant IMD products. If it were, additional isolation could be added to the combiner network to reduce the contribution to the point of being negligible.

Figure 4:
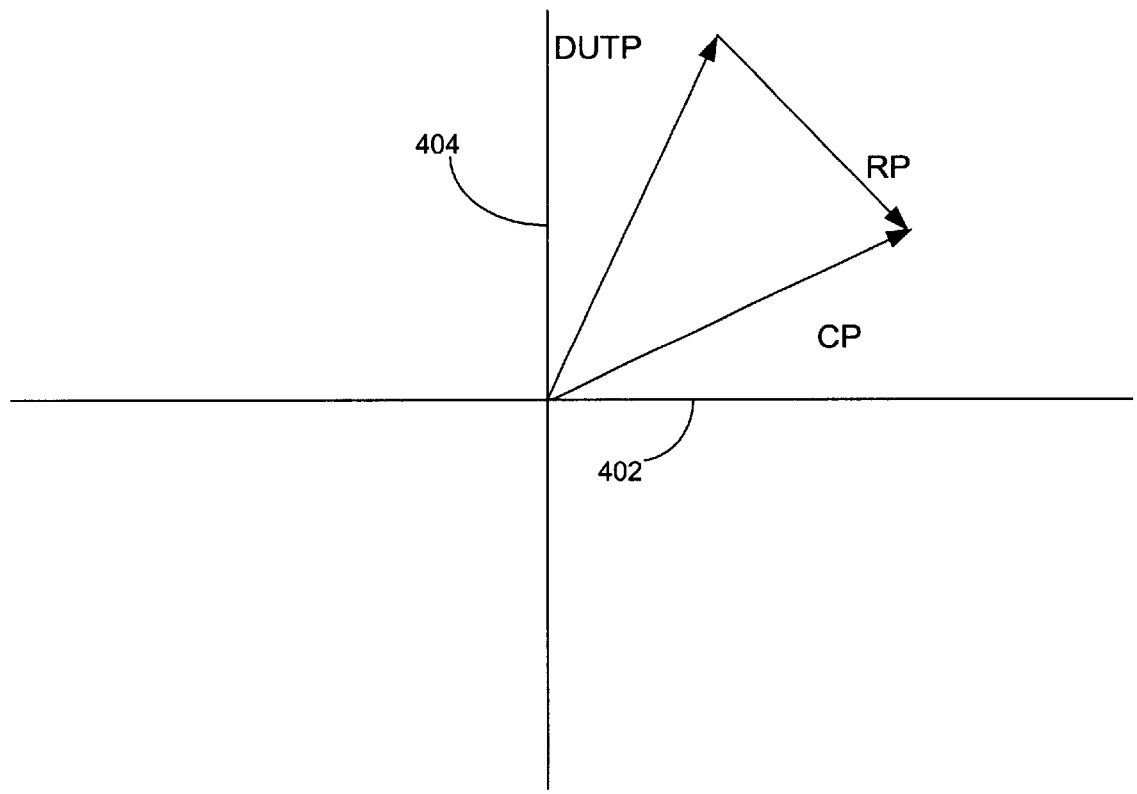
FIG. 4 shows a vector diagram illustrating the relationship between a DUT IMD product (DUTP), a receiver IMD product (RP) and a composite IMD product (CP)

FIG. 4 is a vector diagram 400 illustrating the relationship between the DUT IMD product (DUTP), the receiver IMD product (RP) and the composite IMD product (CP). The horizontal axis 402 is the real axis, and the vertical axis 404 is the imaginary axis. Each of these IMD products have been ratioed against reference IMD products and assume a quasi-small signal receiver combination.

Equation 1 does not take into account phase differences that maybe due to the electrical length of the DUT (e.g., DUT 244) or delays caused by the variable attenuator (e.g., variable attenuator 230). Thus, the phase of the receiver IMD product (RP) should preferably be adjusted for these phase differences. This leads to Equation 2, shown below.

$$DUTP = CP - RP \cdot e^{j \cdot arg\left(\frac{CM}{RM}\right)} \qquad \text{(Equation 2)}$$

DUTP (in Equations 1 and 2) is the actual DUT IMD product ratioed against the reference IMD product. However, this may not always be the most useful expression. A somewhat more useful expression would be DUTP ratioed against the DUT output main tone, which should be amplitude corrected. This can be accomplished by also measuring the reference signal (e.g., signal 226) power, at the selected one of the first frequency ($f_1$) and the second frequency ($f_2$) (the frequency used in steps 306 and 312), to produce an unratioed reference main tone (A1M) measurement. Further, the reference signal power is measured at the frequency associated with the IMD product of interest, to produce an unratioed reference IMD product (A1P) measurement. Then, the DUTP can be rationed against the composite main tone (with amplitude correction) in accordance with Equation 3, shown below.

$$\left|\frac{DUTproduct}{DUTmain}\right| = \left|\frac{DUTP}{CM}\right| \cdot \frac{A1P}{A1M} \qquad \text{(Equation 3)}$$

Figure 5:
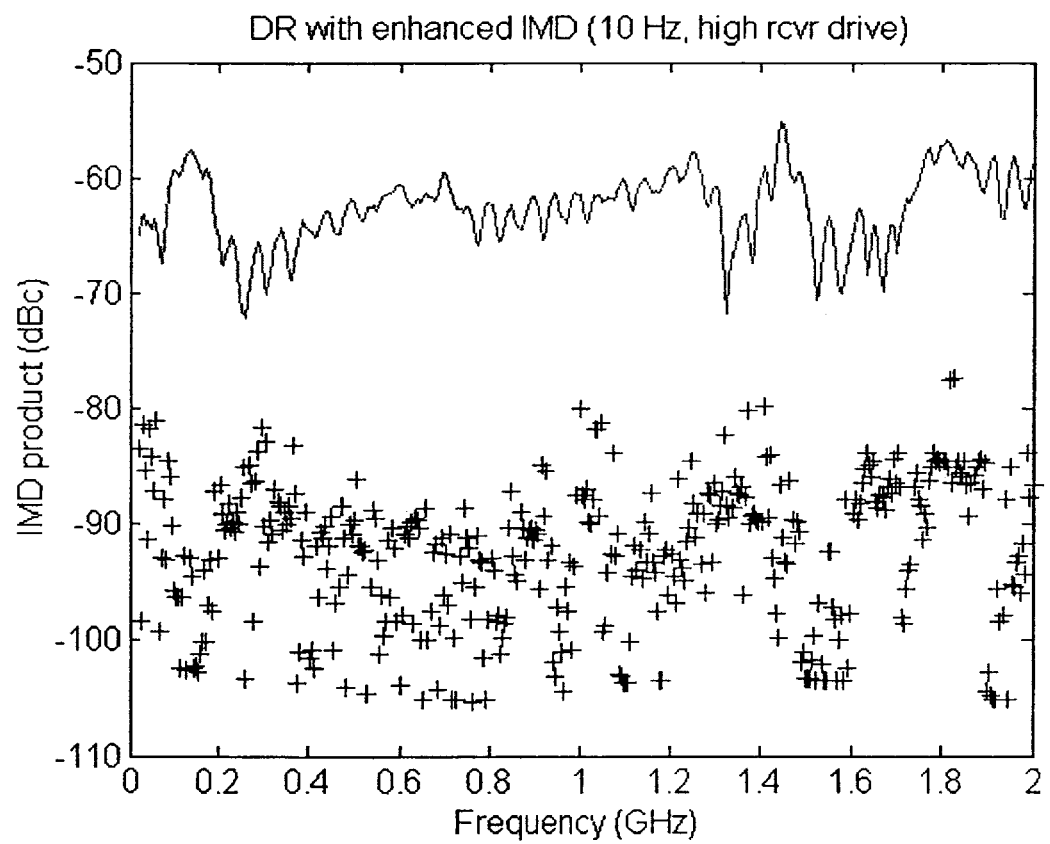
FIG. 5 shows a graph that illustrates dynamic range benefits that can be achieved using embodiments of the present invention.

FIG. 5 shows a graph 500 of frequency (GHz) vs. IMD product (dBc), which is used to show dynamic range benefits that can be achieved using embodiments of the present invention. To produce this graph the system of FIG. 2 is configured for high receiver drive such that receiver IMD products will easily dominate over the noise floor in setting the starting dynamic range. The calibration and measurement are done with the same thru line in place but a period of time was allowed to elapse to emulate temporal drift. The results show approximately a 25 dB improvement in available dynamic range. Specifically, a solid line 502 represents the receiver IMD product (RP) measured with a thru line (e.g., 234) in place during calibration, using the configuration shown in FIG. 2A. The receiver IMD product establishes the dynamic range of an analyzer, which in this example is approximately −55 dBc. This means that an DUT IMD product (DUTP) beyond the range of −55 dBc can not be measured because at this level measurements would be swamped by receiver IMD products (RP). The "+"s in graph 500 represent the receiver IMD product (RP) measurements after applying a calibration, in accordance with the present invention (i.e., after subtracting out measured receiver IMD products (RP)). As shown, the dynamic range is decreased down to about −80 dBc, and thus in this example there is an increase in dynamic range of about −25 dBc, using the present invention.

Figure 6:
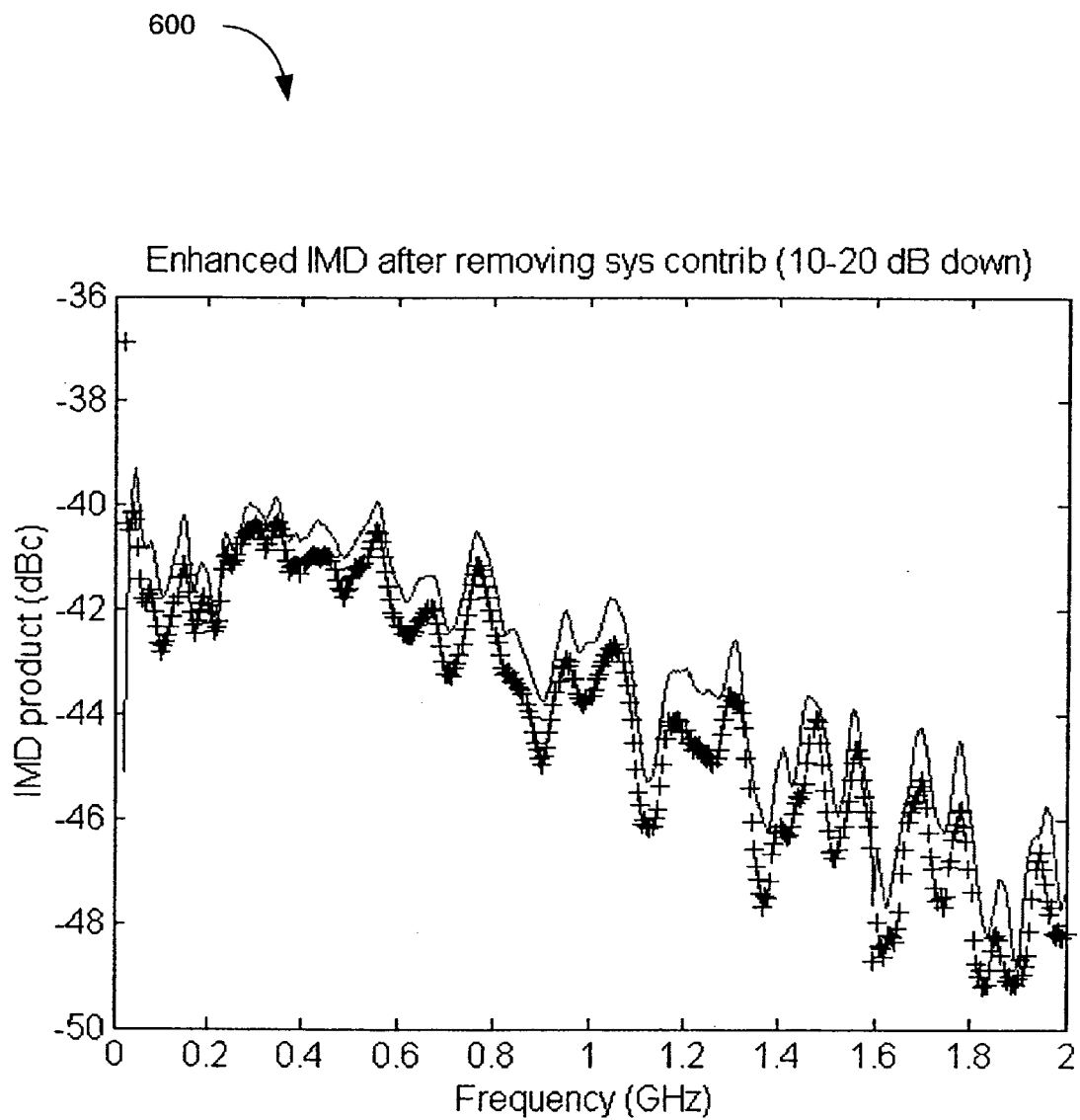
FIG. 6 shows a graph that illustrates IMD product levels of a DUT acquired with and without correction in accordance with embodiments of the present invention.

FIG. 6 shows a graph 600 of frequency (GHz) vs. IMD product (dBc), which is used to show the IMD product levels of a DUT acquired with and without correction. In this example, the DUT was an amplifier with fairly low gain (approximately 6 dB) and IMD products in the range of −40 dBc at the given drive level. The output levels were on the order of 6 dBm. This is higher than is normally recommended, but was chosen to clearly illustrate the effects of enhancement using the present invention. For calibration, the attenuator (i.e., attenuator 230) was set at 0 dB and during the measurement, it was set at 6 dB to equalize the power levels (i.e., of signals 232*a* and 246), as discussed above. During the calibration, the main tone, product and reference signals were all acquired as a function of frequency. During the measurement, the main tone and product levels were acquired with the DUT in place. The corrected IMD product levels were then computed. The results without and with correction are shown in FIG. 6, where a solid line 602 is without correction and a line 604 (made up of "+"s) is with correction. The difference can be seen to be on the order of about 1 dB, depending on frequency. This is consistent with having an interfering signal (i.e., the receiver IMD products) about 10 to 20 dB down. The level of subtraction will, of course, be dependent on the phasing of signals. The receiver IMD products (at the DUT output level) are on the order of −60 to −70 dB, so an effect on the order of 1 dB would be expected. Had the receiver WED products been larger, the correction would have been larger as well.

In the above description, corrected DUT INID products are determined for a DUT to which a signal including two tones (e.g., $f_1$ and $f_2$) is applied. The present invention can also be used if the signal applied to the DUT includes more than two tones. More generally, the present invention can be used to determined correct DUT IMD products for a DUT to which a signal including N tones is applied (where N≧2). N sources are used to produce N signals, with each signal having a different frequency $f_1 \ldots f_N$. The N signals are then combined (e.g., using an N-to-1 combiner) to produce a combined signal having spectral components at the N frequencies $f_1 \ldots f_N$. The remaining analysis is the same as that described above. Thus, the present invention can be used, for example, for three tone testing, which is useful in the cable television field. The IMD products most typically of interest in three tone testing are $f_1 \pm f_2 \pm f_3$.

The foregoing description of the preferred embodiments has been provided to enable any person skilled in the art to make or use the present invention. While the invention has been particularly shown and described with reference to preferred embodiments thereof, it will be understood by those skilled in the art that various changes in form and details maybe made therein without departing from the spirit and scope of the invention.

The present invention has been described above with the aid of flow diagrams illustrating the performance of specified steps and relationships thereof. The boundaries of the blocks within the flow diagrams have often been arbitrarily defined herein for the convenience of the description. Alternate boundaries can be defined so long as the specified steps and relationships thereof are appropriately performed. Any such alternate boundaries are thus within the scope and spirit of the claimed invention. Thus, the breadth and scope of the present invention should not be limited by any of the above-described exemplary embodiments, but should be defined only in accordance with the following claims and their equivalents.

What is claimed is:

1. A method for determining a corrected intermodulation distortion (IMD) product measurement for a device under test (DUT), comprising the steps of:

(a) measuring a ratioed receiver IMD product, the receiver IMD product resulting from non-linearities in a receiver;

(b) measuring a ratioed composite IMD product, the composite IMD product resulting from non-linearities in both the receiver and the DUT; and (c) determining the corrected DUT IMD product (DUTP) by subtracting the ratioed receiver IMD product from the ratioed composite IMD product.

2. A method for using an analyzer to determine a corrected intermodulation distortion (IMD) product measurement for a device under test (DUT), comprising the steps of:

(a) combining a first signal having a first frequency ($f_1$) and a second signal having a second frequency ($f_2$) to produce a combined signal having spectral components at the first frequency ($f_1$) and the second frequency ($f_2$);

(b) splitting the combined signal into a first combined signal and a second combined signal each having spectral components at the first frequency ($f_1$) and the second frequency ($f_2$);

(c) providing the first combined signal to a non-linear device to produce a reference signal having spectral components at the first frequency ($f_1$), the second frequency ($f_2$) and at additional frequencies, the spectral components at the additional frequencies being reference intermodulation distortion (IMD) products;

(d) adjusting a power level of the second combined signal to a desired level;

(e) providing the adjusted second combined signal to a receiver input of the analyzer;

(f) measuring the adjusted second combined signal ratioed to the reference signal, at a frequency associated with an IMD product of interest, to produce a ratioed receiver IMD product (RP) measurement;

(g) providing the second combined signal to the DUT to thereby produce a device output signal;

(h) adjusting the power level of the second combined signal such that the device output signal of the DUT is substantially equal to the desired level;

(i) providing the device output signal to the receiver input of the analyzer;

(j) measuring the device output signal ratioed to the reference input signal, at the frequency associated with the IMD product of interest, to produce a ratioed composite IMD product (CP) measurement; and (k) determining a corrected DUT IMD product (DUTP) in according with the following equation: DUTP=CP−RP.

3. The method of claim 2, wherein step (a) includes combining the first signal and the second signal using a signal combiner.

4. The method of claim 2, wherein step (b) includes splitting the combined signal into a first combined signal and a second combined signal using a coupler.

5. The method of claim 2, wherein the non-linear device comprises a non-linear amplifier and where step (c) includes providing the first combined signal to the non-linear amplifier to produce the reference signal.

6. The method of claim 2, wherein the adjusting of the power levels of the second combined signal at steps (d) and (h) are performed using a variable attenuator.

7. A method for using an analyzer to determine a corrected intermodulation distortion (IMD) product measurement for a device under test (DUT), comprising the steps of:

(a) combining a first signal having a first frequency ($f_1$) and a second signal having a second frequency ($f_2$) to produce a combined signal having spectral components at the first frequency ($f_1$) and the second frequency ($f_2$);

(b) splitting the combined signal into a first combined signal and a second combined signal each having spectral components at the first frequency ($f_1$) and the second frequency ($f_2$);

(c) providing the first combined signal to a non-linear device to produce a reference signal having spectral components at the first frequency ($f_1$), the second frequency ($f_2$) and at additional frequencies, the spectral components at the additional frequencies being reference intermodulation distortion (IMD) products;

(d) adjusting a power level of the second combined signal to a desired level;

(e) providing the adjusted second combined signal to a receiver input of the analyzer;

(f) measuring the adjusted second combined signal ratioed to the reference signal, at one of the first frequency ($f_1$) and the second frequency ($f_2$), to produce a ratioed receiver main tone (RM) measurement;

(g) measuring the adjusted second combined signal ratioed to the reference signal, at a frequency associated with an IMD product of interest, to produce a ratioed receiver IMD product (RP) measurement;

(h) providing the second combined signal to the DUT to thereby produce a device output signal;

(i) adjusting the power level of the second combined signal such that the device output signal of the DUT is substantially equal to the desired level;

(j) providing the device output signal to the receiver input of the analyzer;

(k) measuring the device output signal ratioed to the reference input signal, at the one of the first frequency ($f_1$) and the second frequency ($f_2$), to produce a ratioed composite main tone (CM) measurement;

(l) measuring the device output signal ratioed to the reference input signal, at the frequency associated with the IMD product of interest, to produce a ratioed composite IMD product (CP) measurement; and (m) determining the corrected DUT IMD product (DUTP) in according with the following equation:

$$DUTP = CP - RP \cdot e^{j \cdot arg\left(\frac{CM}{RM}\right)}.$$

8. The method of claim 7, further comprising the steps of:

measuring the reference signal, at the one of the first frequency ($f_1$) and the second frequency ($f_2$), to produce an unratioed reference main tone (A1M) measurement;

measuring the reference signal, at the frequency associated with the IMD product of interest, to produce an unratioed reference IMD product (A1P) measurement; and determining the corrected DUTP ratioed against the composite main tone (CM) measurement in accordance with the following equation:

$$\left|\frac{DUTproduct}{DUTmain}\right| = \left|\frac{DUTP}{CM}\right| \cdot \frac{A1P}{A1M}.$$

9. The method of claim 8, wherein step (a) includes combining the first signal and the second signal using a signal combiner.

10. The method of claim 8, wherein step (b) includes splitting the combined signal into a first combined signal and a second combined signal using a coupler.

11. The method of claim 8, wherein the non-linear device comprises a non-linear amplifier and where step (c) includes providing the first combined signal to the non-linear amplifier to produce the reference signal.

12. The method of claim 8, wherein the adjusting of the power levels of the second combined signal at steps (d) and (i) are performed using a variable attenuator.

13. A method for use in an environment including an analyzer having a reference input and a receiver input, a first signal source that produces a first signal having a first frequency, a second signal source that produces a second signal having a second frequency, a signal combiner to combine the first and second signals to produce a combined signal having frequency components at the first and the second frequencies, a coupler to split the combined signal into first and second combined signals each having frequency components at the first and the second frequencies, a non-linear device to receive the first combined signal and produce a reference signal having spectral components at the first frequency ($f_1$), the second frequency ($f_2$) and at additional frequencies, the spectral components at the additional frequencies being reference intermodulation distortion (IMD) products, and a variable attenuator that adjusts a power level of the second combined signal, the method comprising the steps of:

(a) adjusting the variable attenuator so that the second combined signal has a desired power level;

(b) providing the adjusted second combined signal to the receiver input of the analyzer;

(c) measuring the adjusted second combined signal ratioed to the reference signal, at the first frequency, to produce a ratioed receiver main tone (RM) measurement;

(d) measuring the adjusted second combined signal ratioed to the reference signal, at a frequency associated with an IMD product of interest, to produce a ratioed receiver IMD product (RP) measurement;

(e) providing the second combined signal to the DUT to thereby produce a device output signal;

(f) adjusting the variable attenuator so that the device output has a power level substantially equal to the desired level;

(g) providing the device output signal to the receiver input of the analyzer;

(h) measuring the device output signal ratioed to the reference input signal, at the first frequency, to produce a ratioed composite main tone (CM) measurement;

(i) measuring the device output signal ratioed to the reference input signal, at the frequency associated with the IMD product of interest, to produce a ratioed composite IMD product (CP) measurement; and (j) determining a corrected DUT IMD product (DUTP) in according with the following equation:

$$DUTP = CP - RP \cdot e^{j \arg\left(\frac{CM}{RM}\right)}.$$

14. The method of claim 13, further comprising the steps of:

measuring the reference signal, at the one of the first frequency ($f_1$) and the second frequency ($f_2$), to produce an unratioed reference main tone (A1M) measurement;

measuring the reference signal, at the frequency associated with the IMD product of interest, to produce an unratioed reference IMD product (A1P) measurement; and determining the corrected DUTP ratioed against the composite main tone (CM) measurement in accordance with the following equation:

$$\left|\frac{DUTproduct}{DUTmain}\right| = \left|\frac{DUTP}{CM}\right| \cdot \frac{A1P}{A1M}.$$

15. A method for using an analyzer to determine a corrected intermodulation distortion (IMD) product measurement for a device under test (DUT), comprising the steps of:

(a) combining N signals each having a different frequency to produce a combined signal having spectral components at N frequencies, where $N \geq 2$;

(b) splitting the combined signal into a first combined signal and a second combined signal each having spectral components at the N frequencies;

(c) providing the first combined signal to a non-linear device to produce a reference signal having spectral components at the N frequencies and at additional frequencies, the spectral components at the additional frequencies being reference intermodulation distortion (IMD) products;

(d) adjusting a power level of the second combined signal to a desired level;

(e) providing the adjusted second combined signal to a receiver input of the analyzer;

(f) measuring the adjusted second combined signal ratioed to the reference signal, at a frequency associated with an IMD product of interest, to produce a ratioed receiver IMD product (RP) measurement;

(g) providing the second combined signal to the DUT to thereby produce a device output signal;

(h) adjusting the power level of the second combined signal such that the device output signal of the DUT is substantially equal to the desired level;

(i) providing the device output signal to the receiver input of the analyzer;

(j) measuring the device output signal ratioed to the reference input signal, at the frequency associated with the IMD product of interest, to produce a ratioed composite IMD product (CP) measurement; and (k) determining a corrected DUT IMD product (DUTP) based on the ratioed composite IMD produce (CP) measurement and the ratioed receiver IMD product (RP) measurement.

16. The method of claim 15, wherein step (k) comprises determining the corrected DUT IMD product (DUTP) in according with the following equation: DUTP=CP−RP.

17. A method for using an analyzer to determine a corrected intermodulation distortion (IMD) product measurement for a device under test (DUT), comprising the steps of:

(a) combining N signals each having a different frequency to produce a combined signal having spectral components at N frequencies, where $N \geq 2$;

(b) splitting the combined signal into a first combined signal and a second combined signal each having spectral components at the N frequencies;

(c) providing the first combined signal to a non-linear device to produce a reference signal having spectral components at the N frequencies and at additional frequencies, the spectral components at the additional frequencies being reference intermodulation distortion (IMD) products;

(d) adjusting a power level of the second combined signal to a desired level;

(e) providing the adjusted second combined signal to a receiver input of the analyzer;

(f) measuring the adjusted second combined signal ratioed to the reference signal, at one of the N frequencies, to produce a ratioed receiver main tone (RM) measurement;

(g) measuring the adjusted second combined signal ratioed to the reference signal, at a frequency associated with an IMD product of interest, to produce a ratioed receiver IMD product (RP) measurement;

(h) providing the second combined signal to the DUT to thereby produce a device output signal;

(i) adjusting the power level of the second combined signal such that the device output signal of the DUT is substantially equal to the desired level;

(j) providing the device output signal to the receiver input of the analyzer;

(k) measuring the device output signal ratioed to the reference input signal, at the one of the N frequencies, to produce a ratioed composite main tone (CM) measurement;

(l) measuring the device output signal ratioed to the reference input signal, at the frequency associated with the IMD product of interest, to produce a ratioed composite IMD product (CP) measurement; and (m) determining the corrected DUT IMD product (DUTP) in according with the following equation:

$$DUTP = CP - RP \cdot e^{j arg\left(\frac{CM}{RM}\right)}.$$

18. The method of claim 17, further comprising the steps of:

measuring the reference signal, at the one of the N frequencies, to produce an unratioed reference main tone (A1M) measurement;

measuring the reference signal, at the frequency associated with the IMD product of determining the corrected DUTP ratioed against the composite main tone (CM) measurement in accordance with the following equation:

$$\left|\frac{DUTproduct}{DUTmain}\right| = \left|\frac{DUTP}{CM}\right| \cdot \frac{A1P}{A1M}.$$

* * * * *

UNITED STATES PATENT AND TRADEMARK OFFICE
CERTIFICATE OF CORRECTION

PATENT NO. : 6,766,262 B2
DATED : July 20, 2004
INVENTOR(S) : Jon S. Martens

It is certified that error appears in the above-identified patent and that said Letters Patent is hereby corrected as shown below:

Column 11,
Line 6, delete "according" and insert therefor -- accordance --.

Column 12,
Line 2, delete "according" and insert therefor -- accordance --.

Column 13,
Line 22, delete "according" and insert therefor -- accordance --.

Column 14,
Line 17, after "IMD," delete "produce" and insert therefor -- product --.
Line 22, delete "according" and insert therefor -- accordance --.

Column 16,
Line 2, after "of" add -- interest, to produce an unratioed reference IMD product (A1P) measurement; and --.

Signed and Sealed this

Fifth Day of October, 2004

JON W. DUDAS
*Director of the United States Patent and Trademark Office*